(12) United States Patent
Hasegawa et al.

(10) Patent No.: US 7,164,269 B2
(45) Date of Patent: Jan. 16, 2007

(54) NUCLEAR MAGNETIC RESONANCE PROBE COIL

(75) Inventors: Haruhiro Hasegawa, Kokubunji (JP); Hisaaki Ochi, Kodaira (JP); Hiroyuki Yamamoto, Kokubunji (JP); Kazuo Saitoh, Kodaira (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 11/188,957

(22) Filed: Jul. 26, 2005

(65) Prior Publication Data

US 2006/0119359 A1 Jun. 8, 2006

(30) Foreign Application Priority Data

Dec. 2, 2004 (JP) .............................. 2004-349462

(51) Int. Cl.
*G01V 3/00* (2006.01)

(52) U.S. Cl. ........................................ 324/318; 324/322

(58) Field of Classification Search ................ 324/322, 324/318, 319, 312, 314, 309, 307, 300; 505/201, 505/202, 844; 600/410
See application file for complete search history.

(56) References Cited

U.S. PATENT DOCUMENTS 5,126,319 A * 6/1992 Sen .............................. 505/235
5,585,723 A * 12/1996 Withers ........................ 324/318
6,335,622 B1 * 1/2002 James et al. .................. 324/318
6,633,161 B1 * 10/2003 Vaughan, Jr. ................ 324/318
6,768,306 B1 * 7/2004 Morita et al. ................ 324/322
6,798,204 B1 * 9/2004 Seeber et al. ................ 324/318
6,828,791 B1 * 12/2004 Morita et al. ................ 324/318
6,967,482 B1 * 11/2005 Morita et al. ................ 324/322
2006/0119360 A1 * 6/2006 Yamamoto et al. .......... 324/318

FOREIGN PATENT DOCUMENTS

| EP | 1 471 363 A2 | 3/2004 |
| EP | 1 486 793 A2 | 5/2004 |
| JP | 11-133127 | 8/1998 |
| WO | WO 2004/038431 A2 | 10/2003 |
| WO | WO 2005/078468 A2 * | 1/2004 |

* cited by examiner

*Primary Examiner*—Brij B. Shrivastav
(74) *Attorney, Agent, or Firm*—Reed Smith LLP; Stanley P. Fisher, Esq.; Juan Carlos A. Marquez, Esq.

(57) ABSTRACT

A solenoid-type probe coil wherein superconductive thin film is used, whose quality factor is high, and which is put in an uniform magnetic field and occupies a small space is provided. For that purpose, the coil is made by piling up, in generally parallel, two or more substrates on which superconductive film is formed and connecting superconductors and normal-metal thin films through capacitance or low contact resistance.

6 Claims, 8 Drawing Sheets

NUCLEAR MAGNETIC RESONANCE PROBE COIL

CLAIM OF PRIORITY

The present application claims priority from Japanese application JP2004-349462 filed on Dec. 2, 2004, the content of which is hereby incorporated by reference into this application.

FIELD OF THE INVENTION

The present invention relates to the construction of a nuclear magnetic resonance probe coil for an NMR (Nuclear Magnetic Resonance) apparatus comprising (i) a superconductive magnet to apply a static magnetic field to a sample and (ii) a probe whose tip is provided with the nuclear magnetic resonance probe coil, whose means of detecting output signals is formed out of superconductive thin film.

BACKGROUND OF THE INVENTION

The construction of a conventional nuclear magnetic resonance probe coil comprising superconductive thin film is discussed in the patent literature 1 (Japanese Patent Laid-Open No. H11(1999)-133127). The invention relates to a so-called birdcage-type probe coil, and the direction of the static magnetic field and the directions of insertion and drawing out of a sample are parallel.

To make a high-resolution, high-sensitivity NMR apparatus, it is effective to apply a strong static magnetic field to a sample or use a high-sensitivity probe coil. To generate an uniform, strong magnetic field, it is desirable to make the diameter of the coil to produce the magnetic field small and it is necessary to make small the space occupied by the probe coil disposed in the coil. The probe coil forms a resonance circuit. To make a high-sensitivity probe coil, it is effective to raise the quality factor of the probe coil. To achieve a high quality factor, it is necessary to reduce the resistance in the probe coil.

A trial to make a probe coil of superconductive thin film is discussed in the Japanese Patent Laid-Open No. H11 (1999)-133127. As the direct-current resistance of a superconductor is zero and its high-frequency resistance is small, it is useful as a constituent of a probe coil. In this case, the resistance in the resonance circuit is expressed as a sum of the resistance of constituents and that of their connections, and the contribution of the constituent made of superconductive thin film can be ignored. Accordingly, the resistance in a resonance circuit which comprises superconductive thin film is lower than the resistance in a resonance circuit which does not comprise superconductive thin film.

However, although the above prior art relates to a probe coil made of superconductive thin film, it discusses the construction of a so-called birdcage-type probe coil. To make a high-sensitivity probe coil, it is effective to achieve a high quality factor, improve the uniformity of the magnetic field, reduce the space occupied by the probe coil, and use a solenoid-type probe coil, but the above prior art does not discuss the construction of a solenoid-type probe coil.

That is because the birdcage-type probe coil is used in the NMR device wherein the direction of the static magnetic field and the directions of insertion and drawing out of a sample are parallel, whereas the solenoid-type probe coil is used in the NMR device wherein the direction of the static magnetic field and the directions of insertion and drawing out of a sample are orthogonal. Namely, although the former device has been studied very much, the latter device has not been studied very much. As a result, the solenoid-type probe coil has not been studied very much.

SUMMARY OF THE INVENTION

The object of the present invention is to provide a solenoid-type probe coil wherein superconductive thin film is used. More specifically, the object of the present invention is to provide a solenoid-type probe coil wherein superconductive thin film is used, whose quality factor is high, and which is put in an uniform magnetic field and occupies a small space.

The above object of the present invention is achieved by an NMR probe coil, whose means of receiving the signals outputted from a sample is a solenoidal coil, which comprises (i) two or more generally parallel substrates on which superconductive thin film is formed and (ii) wiring between or among the substrates.

The NMR probe coil of the present invention is a low-resistance solenoidal coil which is made by piling up, in generally parallel, two or more substrates on which superconductive film is formed and connecting superconductors and normal-metal films through capacitance or low contact resistance. Capacitance connection is made by forming superconductive thin film on one side of a substrate and normal-metal film on the other side of the substrate. Low contact-resistance connection is made by forming superconductive thin film and normal-metal film continuously without exposing them to the atmosphere. Besides, by disposing the axis of the solenoid orthogonally to the direction of the static magnetic field, the superconductors in interlinkage with the lines of magnetic force are only the thin parts of the superconductive thin film.

DESCRIPTION OF THE PREFERRED EMBODIMENT

Figure 1:
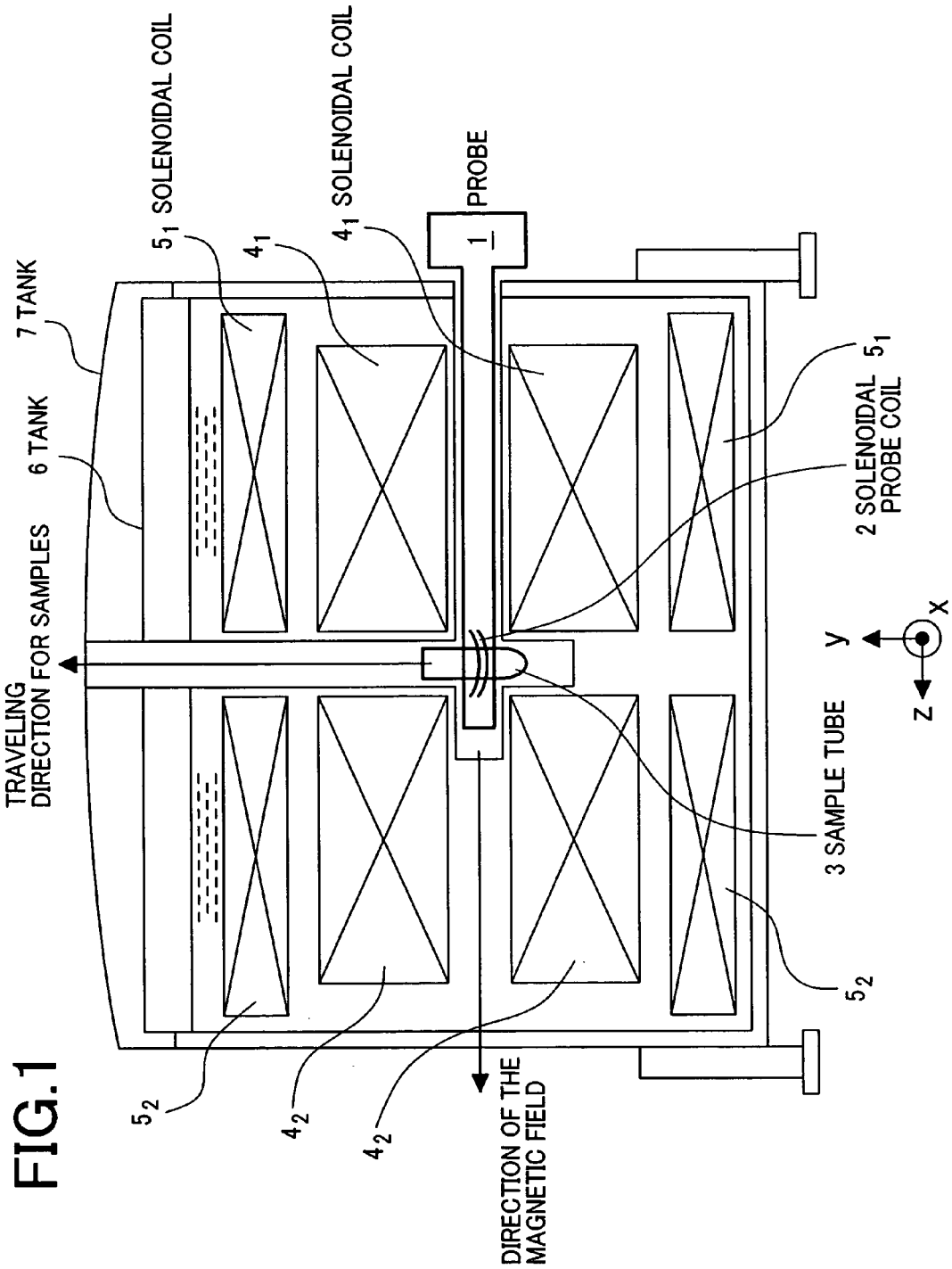
FIG. 1 is a sectional view of an NMR apparatus comprising the probe coil 2 of the first embodiment of the present invention.

An NMR apparatus comprises a means of applying a static magnetic field to a sample and a probe. The probe is provided with a probe coil at its tip. The probe coil comprises a transmitting probe coil to input a high-frequency signal into a sample and a receiving probe coil to receive the signal outputted from the sample. The receiving probe coil detects the component of the magnetic moment outputted from the sample orthogonal to the static magnetic field. The receiving probe coil can serves as a transmitting probe coil. Namely, the receiving probe coil transmits a high-frequency signal to a sample and receives after a certain time the signal outputted from the sample. Although the present invention discusses mainly the construction of receiving probe coils, it is applicable to transmitting-cum-receiving probe coils, too.

According to prior art for high-sensitivity NMR apparatuses, a super conductive magnet is used to apply a vertical static magnetic field to a sample and the sample is inserted and drawn out vertically. Because it is necessary for the receiving probe coil to detect the component of the magnetic moment orthogonal to the static magnetic field, the receiving probe coil of a saddle or birdcage type has been used so that horizontal magnetic moment can be detected.

Embodiments of the present invention will be described below by referring to the drawings.

FIRST EMBODIMENT

In general, there are probe coils of birdcage, saddle, and solenoid types, and solenoid-type probe coils are more sensitive than birdcage- and saddle-type ones. The first embodiment of the present invention is a receiving probe coil of a solenoid type to make a high-sensitivity NMR apparatus.

FIG. 1 is a sectional view of an NMR apparatus comprising the probe coil of the first embodiment of the present invention. A solenoidal coil 4 for applying a static magnetic field to a sample is divided into two $4_1$ and $4_2$ which are disposed side by side. Divided into two $5_1$ and $5_2$ is another solenoidal coil 5, which surrounds the solenoidal coil 4 and corrects the static magnetic field. The solenoidal coils 4 and 5 are fitted into an inner tank 6, which is put in an outer tank 7. The inner tank 6 is filled with liquid helium; the outer tank 7, liquid nitrogen. The bore of the solenoidal coil 4 is partially hollow, and a probe 1 is disposed in the hollow part. A probe coil 2 is provided at the tip of the probe 1 where a static magnetic field is applied to a sample. The probe coil 2 is of a solenoid type. The probe coil 2 is so disposed that the directions of its axis are the same as the directions of movement of a sample and a sample tube 3 can be inserted into it. The sample tube 3 is vertically inserted into and drawn out of the space between the solenoidal coils $4_1$ and $4_2$. Accordingly, the probe coil 2 detects the vertical component of the magnetic moment outputted from a sample. The directions of x, y, and z axes at the bottom of FIG. 1 are shown in the other figures by the same standard.

In the first embodiment, the receiving probe coil is not of a birdcage or saddle type, but of a solenoid type to raise its sensitivity; therefore, it is necessary to divide the superconductive magnet into two and dispose them. To make a high-sensitivity probe coil, it is also necessary to secure the uniformity of the magnetic field, make small the space occupied by the probe coil, and realize a high quality factor.

To obtain an uniform, strong magnetic field, it is desirable to make small the diameter of solenoid coil 4 and it is necessary to make small the space occupied by the probe coil 2. It is necessary in accordance with the first embodiment to make the sample space smaller for an even magnetic field as compared with the prior art wherein an undivided superconductive magnet is used. To achieve a high quality factor, it is effective to form the solenoidal probe coil 2 out of a low-resistance or superconductive material.

Figure 2:
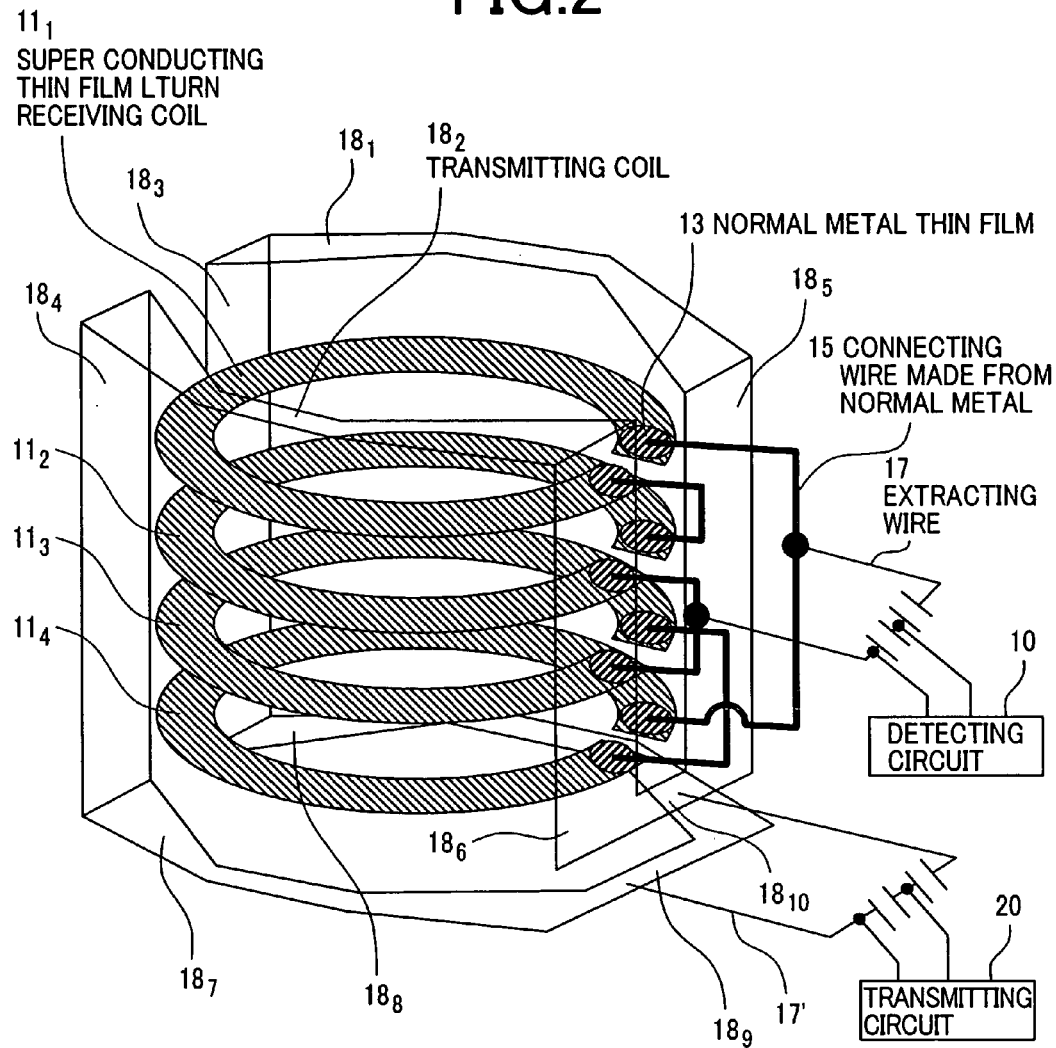
FIG. 2 is a schematic perspective view of the probe coil 2 of FIG. 1.

FIG. 2 is a schematic perspective view of the probe coil 2 of the first embodiment. The probe coil 2 comprises a transmitting probe coil to transmit a high-frequency signal to a sample and a receiving probe coil to detect the signal outputted from the sample. As the receiving probe coil requires higher sensitivity than the transmitting probe coil, the former is of a solenoid type and formed out of oxide superconductive thin film to achieve high sensitivity. On the other hand, the transmitting probe coil is made of a normal metal and of a saddle type, surrounding the receiving probe coil. A static magnetic field is applied horizontally to a sample and the receiving probe coil detects the vertical component of the magnetic moment outputted from the sample.

The reference numerals $11_1$ to $11_4$ are the components of the receiving probe coil 11. Each receiving-probe-coil component is a one-turn coil with an opening formed out of oxide superconductive thin film on one side of a substrate 12. In the first embodiment, the four one-turn components $11_1$ to $11_4$ are disposed in parallel with one another. Two normal-metal thin films 13 are formed on the side of each substrate 12 opposite to the side on which a receiving-probe-coil component is formed. The positions of the two normal-metal thin films 13 on each substrate 12 correspond to the positions of the two ends of the receiving-probe-coil component on said substrate 12 to constitute two capacitors. Normal-metal connecting wires 15 are connected to the normal-metal thin films 13 by resistive connection. Thus, the normal-metal connecting wires 15 and the receiving-probe-coil components $11_1$ to $11_4$ are connected through capacitance, forming a necessary circuit. The components $11_1$ and $11_2$ are connected in series to form a two-turn coil, the components $11_3$ and $11_4$ are connected in series to form another two-turn coil, and these two-turn coils are connected in parallel. Thus, a two-turn two-parallel circuit receiving probe coil is formed. A detecting circuit 10 is connected to the receiving probe coil 11 through normal-metal extracting wires 17. A sample tube 3 is inserted into the inside of the receiving probe coil 11.

The reference numerals $18_1$ to $18_{10}$ are the components of the transmitting probe coil 18, the components $18_1$ to $18_{10}$ assembled to form a saddle-type transmitting probe coil 18. The transmitting probe coil 18 comprises a one-turn coil made of the components $18_1$, $18_3$, $18_5$, and $18_8$ and another one-turn coil made of the components $18_2$, $18_4$, $18_6$, and $18_7$, and the two one-turn coils are connected in parallel to surround the receiving probe coil 11. A transmitting circuit 20 applies a large pulse current to the transmitting probe coil 18 through normal-metal extracting wires 17', which are connected to the component $18_9$ and $18_{10}$, so as to cause the sample to generate a magnetic moment containing a component orthogonal to the static magnetic field. When the component of the magnetic moment orthogonal to the static magnetic field attenuates gradually, the receiving probe coil 11 receives a signal outputted from the sample.

The receiving probe coil 11 constitutes an inductance (L)-capacitance (C) resonance circuit, the inductance being of a trimmer capacitor (not shown) in the probe 1 and the receiving probe coil 11, the capacitance being between the normal-metal connecting wires 15 and the oxide superconductive thin films $11_1$ to $11_4$. To increase the sensitivity of detection, it is necessary to increase the quality factor of the LC resonance circuit. To increase the quality factor of the LC resonance circuit, it is necessary to decrease the parasitic, or incidental, resistance in the LC resonance circuit; accordingly, the solenoidal coil of the present invention is made of a superconductive material.

To achieve a high sensitivity, it is necessary to enhance the uniformity of the magnetic field. A superconductor is diamagnetic and has a large magnetic susceptibility of $-\frac{1}{4}\pi$. In the first embodiment of the present invention, superconductors are so disposed that the interlinkage between them and the lines of magnetic force occurs as little as possible in order not to disturb the distribution of the magnetic field. Namely, a one-turn coil was formed out of a superconductive thin film $11_i$ on a substrate 12 and four substrates were piled up to constitute a solenoid-type probe coil 11. The substrates 12 are so arranged that their normal lines are orthogonal to the direction of the magnetic field and only the thin parts of the superconductive thin films $11_1$ to $11_4$ are in interlinkage with the lines of magnetic force.

To make a more-than-one-turn solenoidal receiving probe coil, it is necessary to connect one-turn coils on substrates with wire. In the first embodiment of the present invention, thin film of the oxide superconductive material $YBa_2Cu_3O_7$ is used, but the problem in connecting the superconductive thin films formed on substrates is that the contact resistance is large if normal metal-oxide superconductor connection is merely made by using an ordinary manufacturing process. Namely, if an oxide superconductive thin film is formed on a substrate and the film is processed by lithography into a circular one-turn coil and then a normal metal such as Au is connected to the oxide superconductive thin film by using an ordinary manufacturing process, the contact resistance between Au and the oxide superconductive thin film is large and the parasitic, or incidental, resistance in the LC resonance circuit is large, reducing the quality factor. To solve this problem, in the first embodiment of the present invention, insulators are put between the oxide superconductive thin films $11_1$ to $11_4$ and the normal-metal thin films 13 to form capacitors, and the normal-metal thin films 13 and the normal-metal connecting wires 15 are connected by resistive connection. Thus, because the normal-metal connecting wires 15 and the oxide superconductive thin films $11_1$ to $11_4$ are connected through the capacitance, the problem of high contact resistance can be avoided. The normal-metal connecting wires 15 are connected to the detecting circuit 10 through the normal-metal extracting wires 17.

A birdcage-type probe coil of superconductive thin film is disclosed in the Japanese Patent Laid-Open No. H11(1999)-133127. In this case too, connecting wires and oxide superconductive thin films are connected through capacitance. However, superconductive thin film is formed on only one side of a substrate and the substrate is pressed into a connecting ring with a press. The distance between the two conductors constituting a capacitor and hence its capacitance depend on the pressing force; therefore, it is difficult to make capacitors with the exactly desired characteristics. Besides, the above prior art discusses a method of wiring applicable to birdcage-type probe coils and not a method of wiring applicable to solenoid-type probe coils.

The first embodiment of the present invention is a solenoidal coil of a superconductive material whose quality factor is high when a static magnetic field is applied horizontally and which is put in an uniform magnetic field and occupies a small space.

In the first embodiment of the present invention, oxide superconductive thin films of $YBa_2Cu_3O_7$ are used as superconductors. Substrates on which superconductive thin films are formed have to be made of a non-magnetic material to secure the uniformity of the magnetic field. Besides, it is necessary to use a material of high thermal conductivity in order to secure the cooling of superconductive thin films. To satisfy both the requirements, substrates made of sapphire are used in the first embodiment.

Figure 3A:
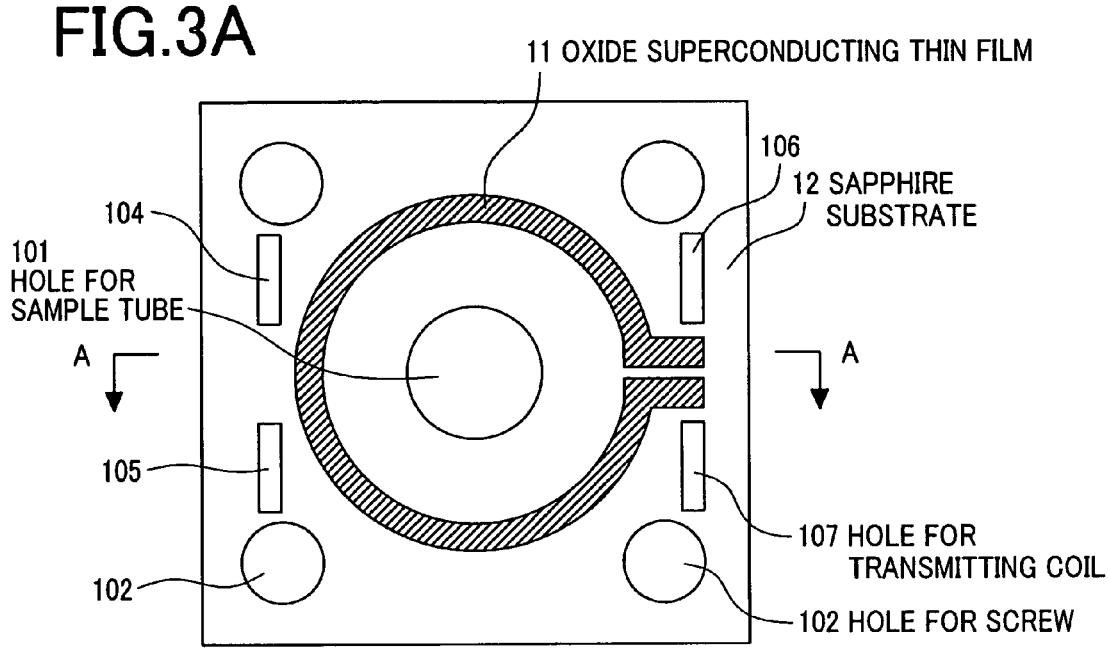
FIGS. 3A to 3C are illustrations of a one-turn coil of a superconductive thin film 11 formed on a substrate 12 in accordance with the first embodiment of the present invention.
Figure 3B:
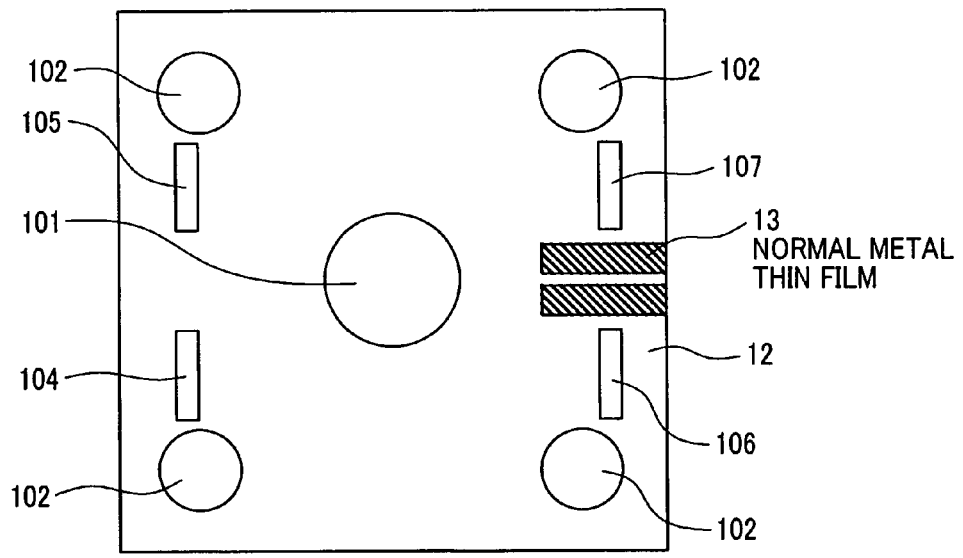
Figure 3C:
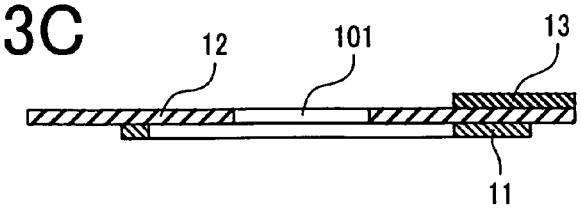

FIGS. 3A to 3C are illustrations of a one-turn coil of superconductive thin film 11 formed on a substrate 12 in accordance with the first embodiment of the present invention. FIG. 3A is a plan view of one side of the substrate 12. The substrate 12 is made of sapphire ($Al_2O_3$). Formed on one side of the substrate 12 is a circular coil made of superconductive thin film 11 of the oxide superconductive material $YBa_2Cu_3O_7$. The two ends of the superconductive thin film 11 are opened and extended outward. The reference numeral 101 is a hole, in which a sample tube 3 is inserted. The reference numerals 102's are screw holes at the four corners, which are used to join piled substrates 12, each having a one-turn coil, to make a probe coil. The reference numerals 104 to 107 are holes, which let the transmitting-probe-coil components $18_4$ to $18_7$ through. FIG. 3B is a plan view of the other side of the substrate 12. The reference numerals 13's are normal-metal thin films of Au, whose positions correspond to the positions of the two ends and two outward extensions of the superconductive thin film 11. FIG. 3C is a sectional view taken along the arrowed line A—A of FIG. 3A, showing that the superconductive thin film 11 is formed on one side of the substrate 12, the normal-metal thin films 13 are formed on the opposite side, and the positions of the normal-metal thin films 13 correspond to the positions of the two ends and two outward extensions of the superconductive thin film 11.

A method of making the one-turn coil of superconductive thin film 11 of FIGS. 3A to 3C will be described below.

First, a film of $CeO_2$ of the thickness of 100 nm is formed as a buffer layer on one side of a sapphire ($Al_2O_2$) substrate 12. Then, a superconductive thin film 11 is formed out of the oxide superconductive material $YBa_2Cu_3O_7$. The thickness of the superconductive thin film 11 is larger than the length, 100 nm, of penetration of a magnetic field. If the thickness of thin film of $YBa_2Cu_3O_7$ goes beyond one micrometer, its surface becomes rough; therefore, the appropriate thickness of thin film of $YBa_2Cu_3O_7$ is over 100 nm and below one micrometer. The superconductive thin film 11 of the first embodiment is 150-nm thick. Next, the superconductive thin film 11 is processed into a circular pattern by the ordinary process of application of a resist, photolithography, and Ar etching.

Next, an Nb film is formed as a backing film on the other side of the substrate 12. Then, normal-metal thin films 13 of Au are formed. The thickness of the Au films has to be larger than the depth of penetration and is 10 μm. If an Au film is formed directly on the substrate 12, it is liable to peel off; therefore, an Nb film is formed as a backing film. A Ti film or a film consisting of a Pt layer and a Ti layer may be used as a backing film. Next, the Au films are processed into desired patterns by the ordinary process of application of a resist, photolithography, and Ar etching.

Thus, Au—$Al_2O_3$—$YBa_2Cu_3O_7$ capacitors are formed. Because the thin films of $YBa_2Cu_3O_7$ and Au stick fast to the substrate 12, the distances between the metals constituting the capacitors do not change; therefore, capacitors of a desired capacitance can be made.

Next, a hole 101 for the sample tube, screw holes 102, and holes 104 to 107 for the transmitting coil are made in the substrate 12.

Figure 4A:
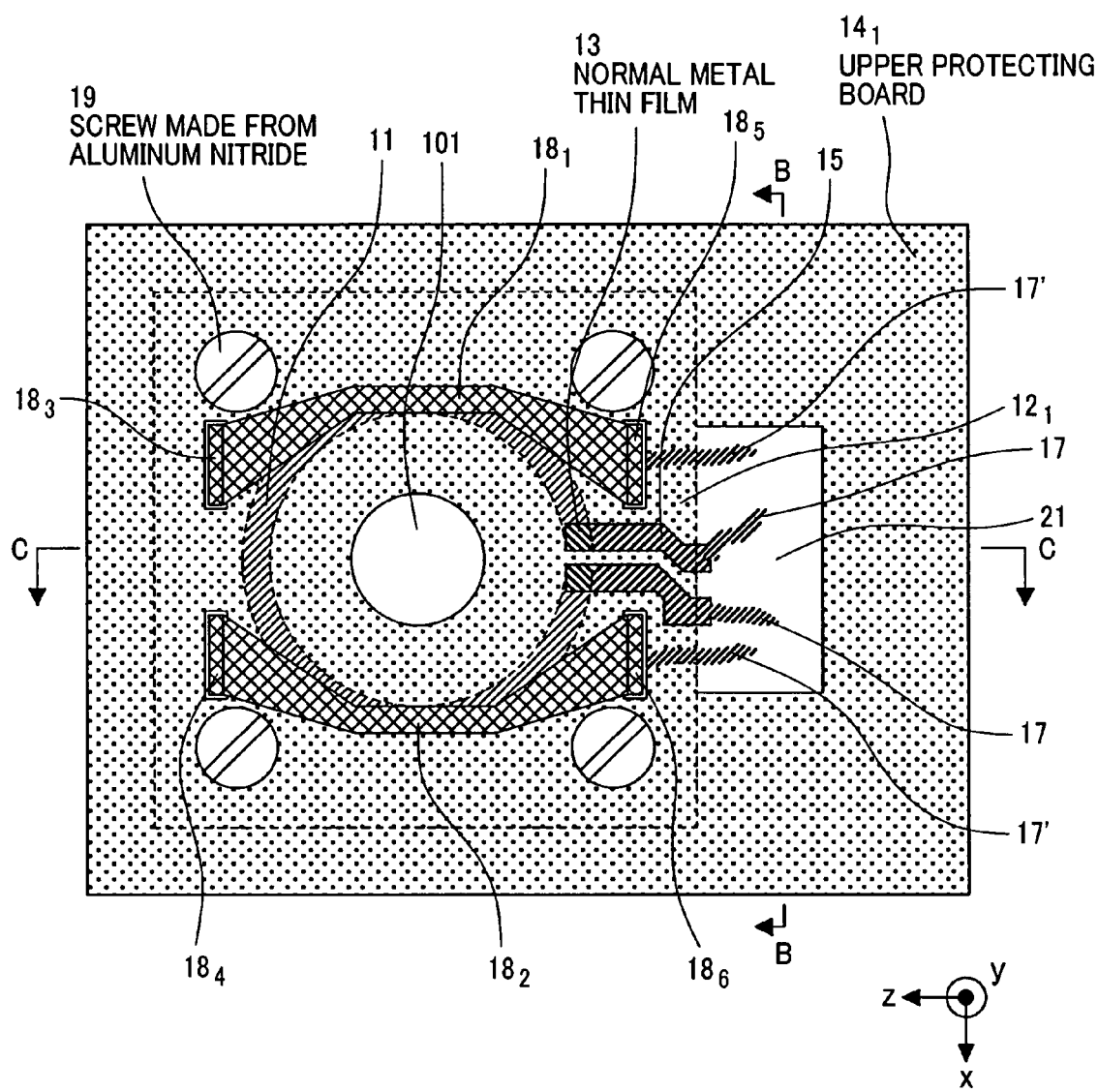
FIG. 4A is a schematic top plan view of the probe coil 2 of FIG. 2.
Figure 4B:
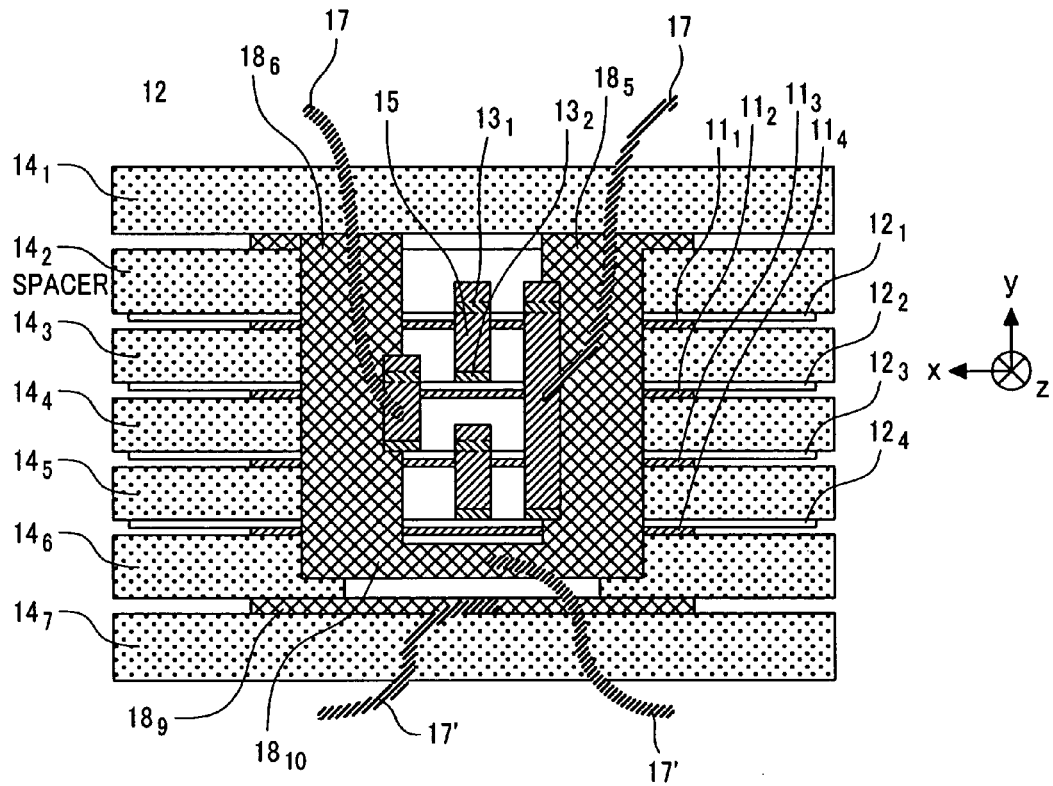
FIG. 4B is a schematic sectional view taken along the arrowed line B—B of FIG. 4A.
Figure 4C:
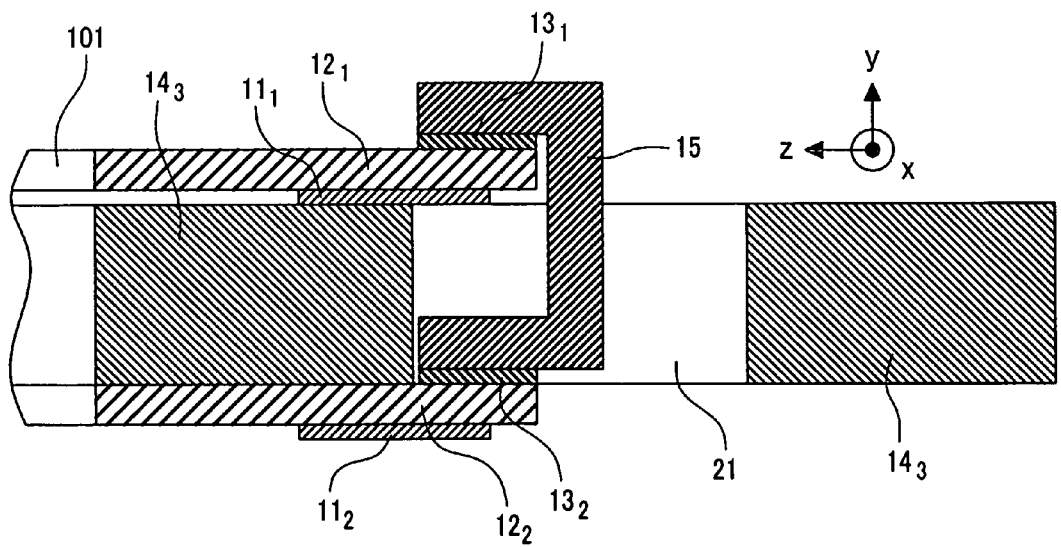
FIG. 4C is a sectional view of two coils between substrates 12, and the two coils between substrates 12 are capacitance-connected by a normal-metal connecting wire 15 which is connected to normal-metal thin films 13 by ultrasonic bonding.

FIGS. 4A to 4C show a probe coil comprising piled one-turn coils of superconductive thin films 11 in accordance with the first embodiment of the present invention.

FIG. 4A is a schematic top plan view of the probe coil of the first embodiment. The reference numeral $14_1$ is an upper protecting board of aluminum nitride disposed at the top of the probe coil. Although the thermal conductivity of aluminum nitride is high, it is an electric insulator; therefore, while insulating the superconductive thin film, the upper protecting board cools it efficiently. The upper protecting board $14_1$ has an aperture 21 which corresponds to the position of the normal-metal connecting wires 15 and the normal-metal extracting wires 17 and 17'. Thus, the top sapphire substrate $12_1$ and the transmitting and receiving probe coils are covered and invisible, but they are shown for the sake of explanation in FIG. 4A. As the receiving-coil component $11_1$ is formed on the bottom side of the sapphire substrate $12_1$, the former is shown by broken lines in FIG. 4A. The reference numerals $13_1$'s are normal-metal thin films whose positions correspond to the positions of the two ends and outward extensions of the receiving-coil component $11_1$. Normal-metal connecting wires 15 are connected to the normal-metal thin films $13_1$, and connected to the normal-metal thin films $13_1$ are normal-metal extracting wires 17 and 17' which appear in the aperture 21. The transmitting-coil components $18_1$ and $18_2$ go down through the corresponding holes, and the transmitting-coil components $18_3$, $18_4$, $18_5$ and $18_6$ go down through the corresponding holes. The reference numeral 19's are aluminum-nitride screws to join the piled substrates 12.

FIG. 4B is a schematic sectional view taken along the arrowed line B—B of FIG. 4A. An aluminum-nitride spacer $14_2$ is disposed under the upper protecting board $14_1$, and the transmitting-coil components $18_1$, and $18_2$ go up through the spacer $14_2$. The shape of the spacer $14_2$ is almost the same as the shape of the upper protecting board $14_1$, but the aperture 21 of the spacer $14_2$ is widened for the connections of normal-metal connecting wires 15. The spacer $14_2$ has holes 101 and 104 to 107 which are the same as the holes 101 and 104 to 107 of each sapphire substrate 12. The same is true of spacers $14_3$ to $14_6$. Then, the sapphire substrate $12_1$ is disposed under the spacer $14_2$, the normal-metal thin films $13_1$ being on the top side of the sapphire substrate $12_1$, the receiving-coil component $11_1$ being on the bottom side of the sapphire substrate $12_1$. Arranged below the sapphire substrate $12_1$ are a spacer $14_3$, a sapphire substrate $12_2$, a spacer $14_4$, a sapphire substrate $12_3$, a spacer $14_5$, a sapphire substrate $12_4$, and a spacer $14_6$. The transmitting-coil components $18_3$, $18_4$, $18_5$, and $18_6$ go down through the corresponding holes of the sapphire substrates and spacers and appear under the spacer $14_6$, and the transmitting-coil components $18_7$, $18_8$, and $18_9$ are arranged, transmitting-coil components $18_3$ and $18_4$ connected to those $18_7$ and $18_8$. Then, disposed is a transmitting-coil component $18_{10}$ to which the components $18_5$ and $18_6$ are connected. Lastly, a lower protecting board $14_7$ is disposed under the spacer $14_6$. After the completion of alternating piling up of sapphire substrates and spacers, they are fixed by the aluminum-nitride screws 19.

FIG. 4C is a sectional view of two coils between substrates 12. The two coils between substrates 12 are capacitance-connected by a normal-metal connecting wire 15 which is connected to normal-metal thin films 13 by ultrasonic bonding. The normal-metal thin films $13_1$ and $13_2$ are connected by the normal-metal connecting wire 15. The aperture 21 of the spacer $14_3$ is widened to avoid the interference with the normal-metal thin films $13_1$ and $13_2$. As already explained by referring to FIG. 2, a normal-metal extracting wire 17 of Cu is connected to a normal-metal connecting wire 15 between the receiving-coil components $11_2$ and $11_3$ by ultrasonic bonding, and another normal-metal extracting wire 17 of Cu is connected to a normal-metal connecting wire 15 between the receiving-coil components $11_1$ and $11_4$ by ultrasonic bonding. These normal-metal extracting wires 17 are used to take signals out of the receiving probe coil 11. A normal-metal extracting wire 17' of Cu is connected to the transmitting-coil component $18_9$ by ultrasonic bonding, and another normal-metal extracting wire 17' of Cu is connected to the transmitting-coil component $18_9$ by ultrasonic bonding. These normal-metal extracting wires 17' are used to send signals into the transmitting probe coil 18.

As already explained by referring to FIG. 2, the receiving probe coil 11 is a two-turn two-parallel circuit coil and each coil component $11_i$ is formed out of a superconductive material on one side of a substrate $12_i$. Formed on the other side of the substrate $12_i$ is a normal-metal thin films $13_i$ of Au whose positions correspond to the positions of the two ends and outward extensions of the coil component $11_i$. The thickness of the Au ribbon lines of the first embodiment is 50 μm to reduce high-frequency resistance, but they may be thicker.

As described above, in the first embodiment of the present invention, capacitors are formed by forming an oxide superconductive thin film on one side of a sapphire substrate and normal-metal films on the other side of the sapphire substrate, the substrate serving as an insulator between the superconductive thin film and the normal-metal films. Thus achieved is metal/superconductor connection through exactly desired capacitance. Besides, the axis of the solenoid is orthogonal to the static magnetic field's direction which is horizontal, and the superconductors are so disposed that the interlinkage between the superconductors and the lines of magnetic force is minimized, the superconductors in interlinkage with the lines of magnetic force being only the thin parts of the superconductive thin films. Thus achieved is a probe coil in an uniform magnetic field.

SECOND EMBODIMENT

The second embodiment of the present invention will be described below by referring to FIG. 5. To raise the quality factor of a probe coil, it is necessary to reduce the resistance in the LC resonance circuit. As described in the section of "Problems to be Solved by the Invention," however, if an ordinary manufacturing process is used, normal metal/oxide superconductor junction of high contact resistance is made. Accordingly, in the first embodiment, an oxide superconductive thin film and a normal-metal film are connected through capacitance. In the second embodiment of the present invention, an improved manufacturing process is used to achieve normal metal/oxide superconductor junction of low contact resistance. By using this, oxide superconductive thin films and normal-metal wires are connected to make a solenoidal coil of superconductive thin films whose quality factor is high.

The construction of the probe coil of the second embodiment is the same as the construction of the probe coil of the first embodiment of FIG. 2 in that both the probe coils comprises a receiving coil of superconductive thin films and a transmitting coil of a saddle type. The second embodiment is different from the first embodiment in that the superconductive thin films of the receiving coil and the normal-metal films for sending signals out of the second embodiment are connected by resistance connection. In FIG. 5, the same components and components of the same functions as in the first embodiment are tagged with the same reference numerals as in the first embodiment.

Figure 5A:
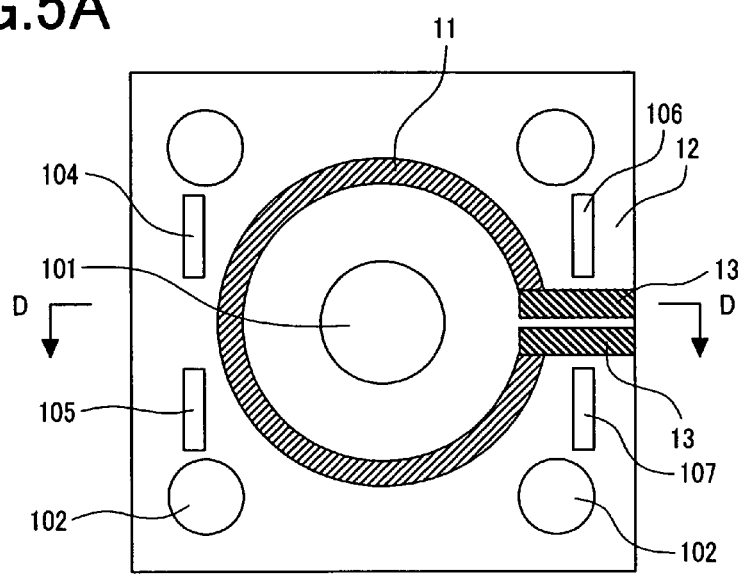
FIG. 5A is an illustration of a one-turn coil of a superconductive thin film 11 and normal-metal thin films 13 of Au formed on a substrate 12 in accordance with the second embodiment of the present invention.
Figure 5B:
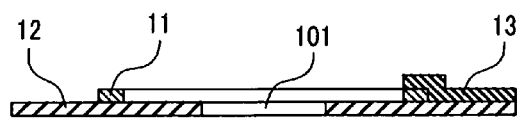
FIG. 5B is a sectional view taken along the arrowed line D—D of FIG. 5A.
Figure 5C:
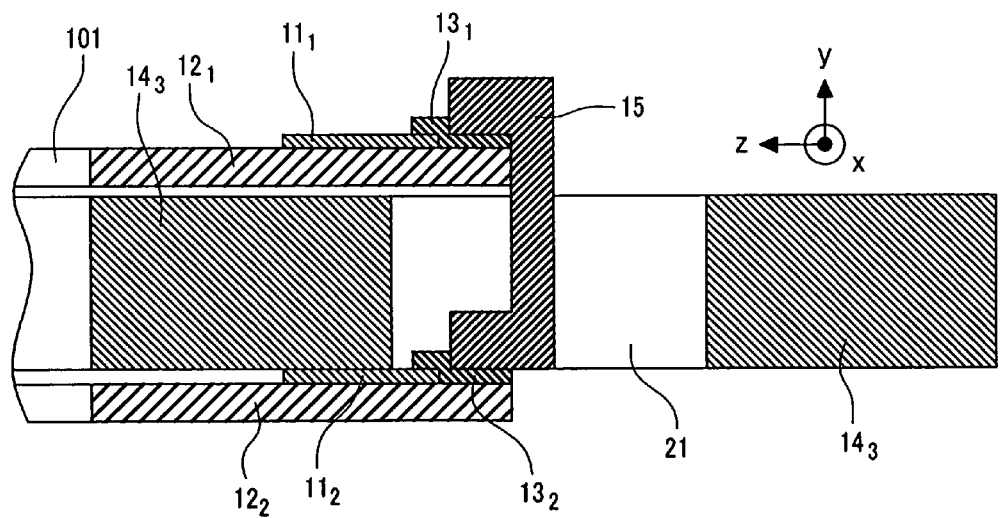
FIG. 5C is a sectional view of two coils between substrates 12, and the two coils between substrates 12 are resistance-connected by a normal-metal connecting wire 15 which is connected to the normal-metal thin films 13 by ultrasonic bonding.

FIG. 5A is an illustration of a one-turn coil of a superconductive thin film 11 and two normal-metal thin films 13 of Au formed on a substrate 12 in accordance with the second embodiment of the present invention. FIG. 5B is a sectional view taken along the arrowed line D—D of FIG. 5A. It can be seen that the two normal-metal thin films 13 of Au is connected to the two open ends of the superconductive thin film 11. FIG. 5C is a sectional view of two coils between substrates 12. The two coils between substrates 12 are connected by a normal-metal connecting wire 15 which is connected to a normal-metal thin film 13 of one coil and a normal-metal thin film 13 of the other coil by ultrasonic bonding.

As shown in FIG. 5A, a film of $CeO_2$ of the thickness of 100 nm is first formed as a buffer layer on one side of a sapphire substrate 12. Then, a superconductive thin film 11 of the thickness of 150 nm is formed out of the oxide superconductive material $YBa_2Cu_3O_7$. Next, the sample is conveyed into another chamber in a vacuum device without exposing the sample to the atmosphere and then transferred to a substrate holder so as to form two films out of Au at a desired area where normal metal-oxide superconductor connection is to be made. Then, two normal-metal films 13 of the thickness of one micrometer are formed out of Au. Next, the superconductive thin film 11 is processed into a circular pattern by application of a resist, photolithography, and Ar etching. Then, the Au films are processed into desired patterns by application of a resist, photolithography, and Ar etching. Next, the substrate 12 with the films was annealed at 500° C. in an oxygen atmosphere to increase the oxygen in the $YBa_2Cu_3O_7$ thin film for better superconductivity and reduce the contact resistance between Au and $YBa_2Cu_3O_7$. Thus formed on the substrate 12 is a one-turn coil which is made of a superconductive thin film of $YBa_2Cu_3O_7$ and to which the normal-metal thin films 13 of Au are connected.

If a $YBa_2Cu_3O_7$ thin film is put in contact with water or exposed to the atmosphere during an ordinary manufacturing process such as photolithography, its surface deteriorates and changes into a high-resistance layer. Accordingly, if an Au film is formed after the ordinary manufacturing process such as photolithography, normal metal-oxide superconductor connection of high contact resistance is made. In this embodiment, the Au films are formed without exposing the $YBa_2Cu_3O_7$ thin film to the atmosphere after the formation of the $YBa_2Cu_3O_7$ thin film; therefore, the surface of the $YBa_2Cu_3O_7$ thin film to be put in contact with Au does not deteriorate and hence normal metal/oxide superconductor junction of low contact resistance is made.

It can be seen from FIGS. 5B and 3C that the second embodiment differs from the first embodiment in that the superconductive film 11 and the normal-metal thin films 13 of the second embodiment are formed on one and the same side of a substrate 12 and directly connected.

It can be seen from FIGS. 5C and 4C that the second embodiment differs from the first embodiment in that the superconductive film 11 is formed on the top side of a substrate 12 in the second embodiment, whereas the superconductive film 11 is formed on the bottom side of a substrate 12 in the first embodiment. The second embodiment is the same as the first embodiment in that the normal-metal thin films 13 are connected by normal-metal connecting wires 15 in both the embodiments.

Then, as in the case of the first embodiment, holes are made in the sapphire substrates 12, the substrates 12 are piled up, a transmitting coil 18 is built in, and the normal-metal thin films 13 on the sapphire substrates 12 and the normal-metal connecting wires 15 of Au ribbon lines are connected by ultrasonic bonding to complete the probe coil.

Thus, in the second embodiment, the manufacturing process is improved so that the coil is formed by using an oxide superconductor and the normal-metal films are connected without exposing them to the atmosphere. Therefore, normal metal/oxide superconductor junction with low contact resistance was achieved. Besides, as in the first embodiment, the axis of the solenoid is orthogonal to the static magnetic field's direction which is horizontal and the superconductors are so disposed that the interlinkage between the superconductor and the lines of magnetic force is minimized, the superconductors in interlinkage with the lines of force being only the thin parts of the superconductive thin film. Thus achieved is a probe coil in an uniform magnetic field.

THIRD EMBODIMENT

Now, referring to FIG. 6, the third embodiment of the present invention will be described. In order to increase the quality factor of the probe coil, as in the first embodiment, an oxide superconductive thin film and a normal-metal connecting wire are connected through capacitance, forming a solenoidal coil of a superconductive thin film whose quality factor is high. However, the third embodiment is different from the first embodiment in that the capacitor is provided on a side where the oxide superconductive thin film (coil 11) is formed. The construction of the probe coil of the third embodiment is the same as the construction of the probe coil of the first embodiment of FIG. 2 in that the probe coil comprises a receiving coil of superconductive thin films and a transmitting coil of a saddle type. In FIG. 6, the same components and components of the same functions as in the first and second embodiments are tagged with the same reference numerals.

Figure 6A:
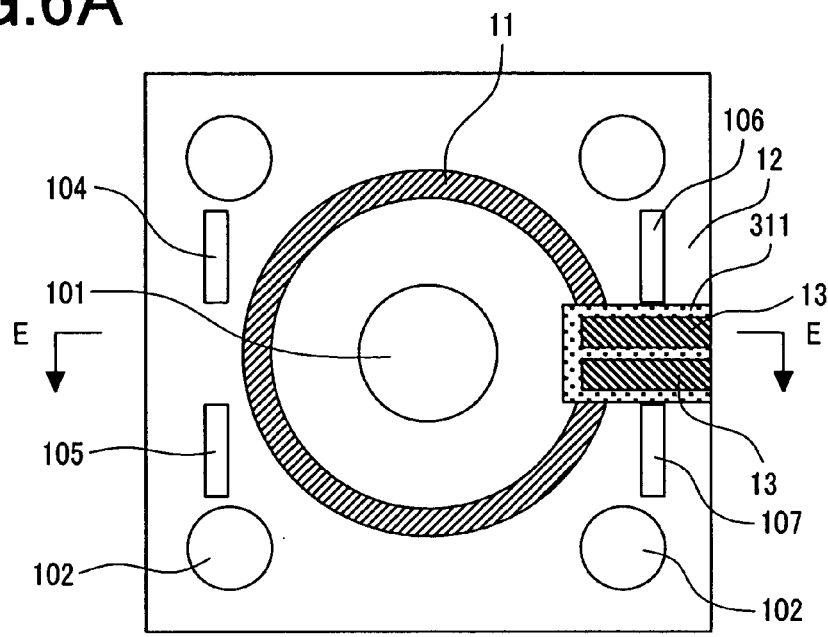
FIG. 6A is an illustration of a substrate 12 with a one-turn coil 11, normal-metal thin films 13, and an insulating layer 311 in accordance with the third embodiment of the present invention, and the insulating layer 311 is formed between the one-turn coil 11 and the normal-metal thin films 13 of Au.
Figure 6B:
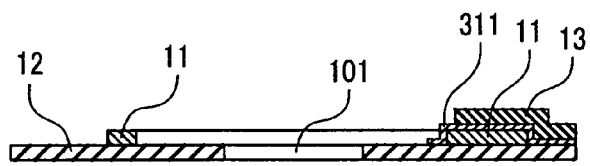
FIG. 6B is a sectional view taken along the arrowed line E—E of FIG. 6A.
Figure 6C:
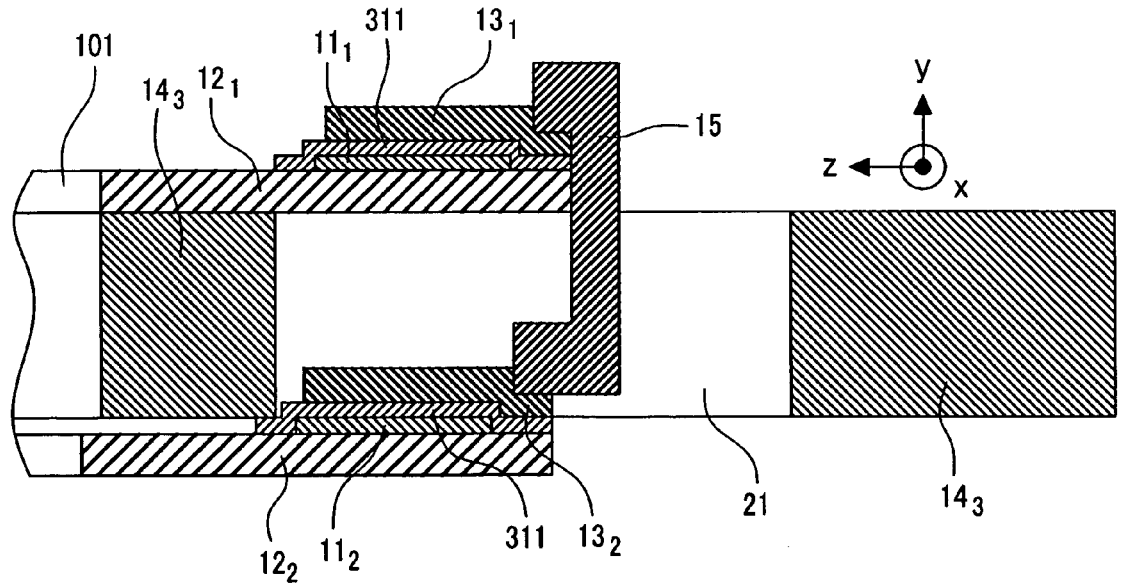
FIG. 6C is a sectional view of two coils between substrates 12, and the two coils between substrates 12 are capacitance-connected by a normal-metal connecting wire 15 which is connected to normal-metal thin films 13 by ultrasonic bonding.

FIG. 6A is an illustration of a substrate 12 with a one-turn coil 11, normal-metal thin films 13, and an insulating layer 311 in accordance with the third embodiment of the present invention. The insulating layer 311 is formed between the one-turn coil 11 and the normal-metal thin films 13. FIG. 6B is a sectional view taken along the arrowed line E—E of FIG. 6A. It can be seen that there are formed ends of the superconductive thin film 11 opened and extended outwardly of the substrate and the insulating layer 311 between normal-metal thin films 13 of Au. FIG. 6C is a sectional view of two coils between substrates 12. The two coils between substrates 12 are capacitance-connected by a normal-metal connection wire 15 which is connected to normal-metal thin films 13 by ultrasonic bonding.

As shown in FIG. 6A, a film of $CeO_2$ of the thickness of 100 nm is first formed as a buffer layer on one side of a sapphire substrate 12. Then, a superconductive thin film 11 of the thickness of 150 nm is formed out of the oxide superconductive material $YBa_2Cu_3O_7$. Next, the $YBa_2Cu_3O_7$ thin film is processed into a circular pattern by application of a resist, photolithography, and Ar etching. Next, the substrate 12 with the films was annealed at 500° C. in an oxygen atmosphere to increase the oxygen in the $YBa_2Cu_3O_7$ thin film for better superconductivity. Photosensitive polyimide of the thickness of 20 micrometer is applied all over the substrate. Then, a desired pattern is formed on the substrate by using lithography, and an insulating layer 311 which is a constituent element of a capacitor is formed. Further, on the insulating layer 311, normal-metal thin films 13 of the thickness of one micrometer are formed out of Au.

It can be seen from FIGS. 6B and 5B that the third embodiment is the same as the second embodiment in that formed on the same side of the substrate 12 is the coil 11 made of a superconductive thin film of $YBa_2Cu_3O_7$ and to which the normal-metal thin films 13 of Au are connected. However, they are different in that the open ends of the coil 11 are extended outwardly of the substrate 12, and the insulating layer 311 is formed between the open ends and the normal-metal thin films 13 of Au.

As shown in FIG. 6C, according to the third embodiment, the coil 11 and the normal-metal thin films 13 of Au are formed on one and the same side of the substrate 12 as in the second embodiment. When compared with the second embodiment shown in FIG. 5C, the third embodiment is the same as the second embodiment in that the normal-metal thin films 13 of Au are connected by normal-metal connecting wires 15 in both the embodiments.

Then, as in the cases of the first and second embodiments, holes are made in the sapphire substrates 12, the substrates 12 are piled up, a transmitting coil 18 is built in, and the normal-metal thin films 13 of Au on the sapphire substrates 12 and the normal-metal connecting wires 15 of Au ribbon lines are connected by ultrasonic bonding to complete the probe coil.

Thus, in the third embodiment, the solenoidal coil is made wherein the connection wires and an oxide superconductive thin film are connected through a capacitor made from $Cu/polyimide/YBa_2Cu_3O_7$. In this way, metal/superconductor connection through exactly desired capacitance is achieved by using the capacitor of $Cu/polyimide/YBa_2Cu_3O_7$. Besides, the axis of the solenoid is orthogonal to the static magnetic field's direction which is horizontal, and the superconductors are so disposed that the interlikage between the superconductors and the lines of magnetic force is minimized, the superconductors in interlinkage with the lines of magnetic force being only the thin parts of the superconductive thin films. Thus achieved is a probe coil in an uniform magnetic field.

OTHER EMBODIMENT

Figure 7:
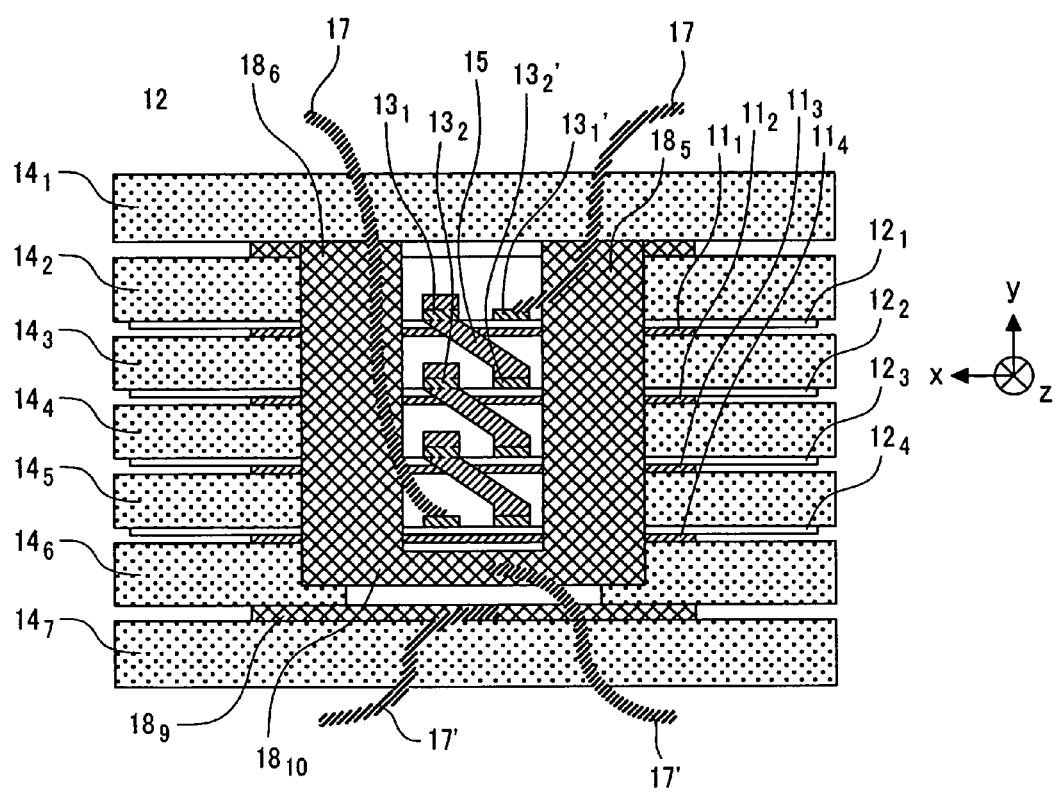
FIG. 7 is a sectional view taken along the arrowed line B—B of FIG. 4A, and the probe coil is converted into a four-turn type.

In each of the first to third embodiments, the receiving probe coil is a two-turn two-parallel circuit coil. However, the receiving probe coil may be a four-turn one-parallel circuit coil. FIG. 7 is a sectional view taken along the arrowed line B—B of FIG. 4A. The probe coil is converted into a four-turn type. Like reference numerals are given to like parts. In the case of a four-turn one-parallel circuit, the beginning and end of the wire of each coil are connected in sequence. Therefore, the coils of the substrates are connected by the normal-metal connecting wires 15 in sequence. A normal-metal thin film $13_1'$ corresponding to a tip of the beginning of the coil $11_1$ is connected to one of the normal-metal extracting wires 17. Further, a normal-metal thin film $13_1$ corresponding to a tip of the end of the coil $11_1$ and a normal-metal thin film $13_2'$ corresponding to a tip of the beginning of the coil $11_2$ are connected to the normal-metal connecting wires 15. In the same way, tips of the ending and beginning of the coils are sequentially connected, and a normal-metal thin film $13_4$ corresponding to a tip of the ending of the last coil $11_4$ is connected to the other normal-metal extracting wire 17. The transmitting coil 18 may be the same as the one described in the first embodiment by referring to FIG. 4B.

Also, in the third embodiment, photosensitive polyimide was used as an insulating material constituting the capacitor. However, the same effect can be produced by using, instead of the photosensitive polyimide, a fluoride-resin film or an insulating film such as the ones made of $CeO_2$ or $Y_2O_3$ formed by a thin-film manufacturing process.

Further, in either of the embodiments, the normal-metal thin film may be of Au, Cu, Ag, or Al.

Though not described specifically, it is needless to say that the probe coil 1 is connected to a lead connected to a cooling source and is cooled.

According to the present invention, a low-resistance solenoidal coil can be provided. Besides, the superconductors in interlinkage with the lines of magnetic force are only the thin parts of the superconductive thin films. Therefore, the present invention can provide a nuclear magnetic resonance probe coil of a solenoid type wherein superconductive thin film is used, whose quality factor is high, and which is put in an even magnetic field and occupies a small space.

What is claimed is:

1. A nuclear magnetic resonance probe coil used in a nuclear magnetic resonance apparatus comprising:
   a plurality of substrates which are arranged in parallel, each substrate having a first surface and a second surface opposite said first surface;
   a plurality of one turn coils made by a superconductive thin film, wherein one of said plurality of one turn coils is formed on the first surface of each of said substrates, wherein in one part of each of said one turn coils is made an opening;
   a plurality of normal metal thin films formed at the corresponding position of the opening of said one turn coil on the second surface of each of said substrates;
   a plurality of normal metal connecting wires connected by resistive connection to said normal metal thin films, wherein said connecting wires connect said one turn coils to each other through an edge of said substrates so that said one turn coils form a receiving solenoidal coil;
   a plurality of spacers which are arranged in parallel between each of said plurality of substrates and under a lowest one of said plurality of substrates;
   a transmitting probe coil which is assembled by normal metal transmittal probe coil components which are supported by holes formed in each of said substrates and spacers, and which surrounds the receiving solenoidal coil;
   an upper protecting board arranged on a highest upper spacer and an upper component of said transmitting probe coil; and a lower protecting board arranged under said lowest spacer and a lower component of said transmitting probe coil, wherein a hole for a sample tube is provided through the upper protecting board, all substrates, all spacers and the lower protecting board at an inner part of said plurality of one turn coils.

2. A nuclear magnetic resonance probe coil according to claim 1, wherein said plurality of normal metal thin films are formed at the opening of said one turn coils by a subsequent process of forming said one turn coils without exposing said substrate to the atmosphere.

3. A nuclear magnetic resonance probe coil according to claim 2, wherein said plurality of normal metal thin films are formed at the opening of said one turn coils through an insulating layer.

4. A nuclear magnetic resonance probe coil according to claim 3, wherein said insulating layer is made from fluoride resin or polyimide resin.

5. A nuclear magnetic resonance probe coil according to claim 1, wherein the normal-metal thin film is of Au, Cu, Ag, or Al.

6. A nuclear magnetic probe coil according to claim 1, wherein the spacer is of aluminum nitride.

* * * * *